United States Patent

Lohwasser et al.

[11] Patent Number: 5,885,357
[45] Date of Patent: Mar. 23, 1999

[54] PROCESS AND DEVICE FOR COATING A SUBSTRATE SURFACE WITH VAPORIZED INORGANIC MATERIAL

[75] Inventors: Wolfgang Lohwasser, Gailingen, Germany; André Wisard, Adlikon, Switzerland

[73] Assignee: Alusuisse Technology & Management Ltd., Switzerland

[21] Appl. No.: 959,456

[22] Filed: Oct. 28, 1997

Related U.S. Application Data

[62] Division of Ser. No. 773,761, Dec. 24, 1996, Pat. No. 5,804,258.

[30] Foreign Application Priority Data

Jan. 10, 1996 [EP] European Pat. Off. ............. 96810020

[51] Int. Cl.⁶ .................................................. C23C 14/00
[52] U.S. Cl. .......................................... 118/723; 118/726
[58] Field of Search ............................. 118/723 EB, 726

[56] References Cited

FOREIGN PATENT DOCUMENTS

| | | |
|---|---|---|
| 0384617 | 8/1990 | European Pat. Off. . |
| 0545863 | 6/1993 | European Pat. Off. . |
| 4239511 | 5/1994 | Germany . |

OTHER PUBLICATIONS

Thin Solid Films, Bd. 256, Nr. 1/02, Feb. 1, 1995, Seiten 124–135, Kajioka H et al.

*Primary Examiner*—Richard Bueker
*Attorney, Agent, or Firm*—Bachman & LaPointe, P.C.

[57] ABSTRACT

In a process for coating a substrate surface with a layer of inorganic material, the inorganic material is vaporised in a vacuum chamber evacuated to at least $10^{-3}$ mbar by bombarding with an electron beam from a high voltage electron-beam gun and deposited on the substrate surface. Gas discharging is created between the point of incidence (A) of the electron beam on the inorganic material to be vaporised and an anode such that the electrostatic charge created by the high voltage electron-beam gun flows off via the anode. This way damage to the substrate, which may arise as a result discharging phenomena, can be effectively avoided.

9 Claims, 1 Drawing Sheet

PROCESS AND DEVICE FOR COATING A SUBSTRATE SURFACE WITH VAPORIZED INORGANIC MATERIAL

This is a Division of application Ser. No. 08/773,761, filed Dec. 24, 1996 now U.S. Pat. No. 5,804,258.

BACKGROUND OF THE INVENTION

The invention relates to a process for coating a substrate surface with a layer of inorganic material, which is vaporized in a vacuum chamber evacuated to $10^{-3}$ mbar or less by bombarding with an electron beam from a high voltage electron-beam gun and deposited on the substrate surface. Within the scope of the invention is also a device for performing and applying the process.

Problems of electrostatic charging arise while electron-beam coating substrate materials that do not conduct electricity. These problems are due to the fact that the electrons from the electron-beam gun are not conducted off in a definite manner, this because the electrostatic charging cannot be led off the electrically insulating coating and substrate materials nor from the coated walls of the vacuum chamber which also become insulating after a certain time.

The charging phenomena express themselves e.g. in non-uniform focusing of the electron-beam, in non-defined alignment of the beam as a result of non-defined electrostatic fields and in charging of the substrate material which, especially when coil coating plastic films, can lead to considerable coiling problems. The electrostatic charge can also lead to pinholes in the film as a result of discharging. The build up of the electrostatic charge can also lead to overlapping of the film.

Known from the European patent document EP-A-0545863 is a process of the kind discussed above, in which a low energy, ionizing electron-beam forming a plasma is passed through the gas phase of inorganic material to an anode. The resultant gas discharging leads to removal of the electrostatic charge. The disadvantage of this mentioned method is that a second electron-beam gun has to be housed in the vacuum chamber.

SUMMARY OF THE INVENTION

In view of these facts, the object of the present invention is to provide a process of the type described above, in which the undesired electrostatic charging inside the vacuum chamber can be prevented effectively using simple means.

SUMMARY OF THE INVENTION

That objective is achieved by way of the invention in that gas discharging is created between the point of incidence of the electron beam on the inorganic material to be vaporized and an anode such that the electrostatic charge created by the high voltage electron-beam gun flows off via the anode.

In order to maintain the electrical conductivity at the surface of the anode, this is preferably heated to a temperature exceeding that at which the vaporized inorganic material condenses. To that end the anode is usefully heated electrically by way of a transformer polarized to couple the heating current into the electrical circuit.

Under optimal process parameter settings, a current equivalent to the emission current of the electron-beam gun flows through the anode voltage supply. This means that the whole of the electrostatic charge created by the electron-beam gun flows off over the anode.

The pressure of gas can vary, in particular in the course of extended coating cycles, to such an extent that the full amount of emission current does not flow off via the anode. It can, therefore, prove advantageous to keep the pressure in the vacuum chamber constant by varying the inlet of gas, in order to stabilize the gas discharging. Regulation is achieved preferably automatically via closed cycle control by means of which the gas pressure is normally set at a value of $10^{-3}$ to $2. 10^{-4}$ mbar.

A device suitable for performing the process according to the invention is such that the anode in the region of the inorganic material to be vaporized is preferably situated outside of the direct vaporization zone.

The inorganic material to be vaporized is normally prepared in a crucible, it may however, also be situated e.g. on a water cooled plate.

As the anode is exposed to high temperatures, it must be made of a suitably temperature resistant material. The anode is therefore preferably of tungsten, tantalum, molybdenum or graphite in the form of wire, rod, tube, mesh or net.

The process according to the invention is suitable in particular for coating plastic films for the packaging industry and in general for coating non-electrically conductive substrate materials with non electrically conductive layers starting from non electrically conductive coating materials.

BRIEF DESCRIPTION OF THE DRAWINGS

Further advantages, features and details of the invention are revealed in the following description of preferred exemplified embodiments of the invention and with the aid of the schematic drawings.

DETAILED DESCRIPTION OF PREFERRED EMBODIMENTS

Figure 1:
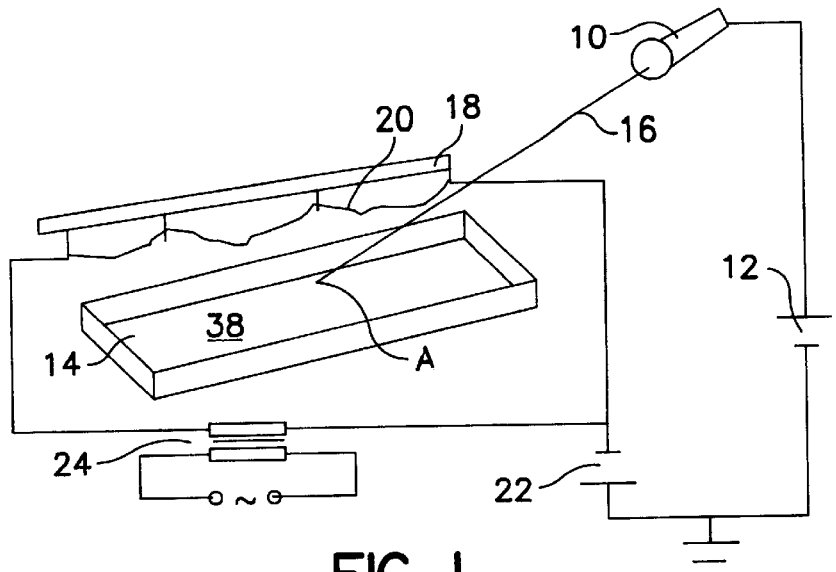
FIG. 1 a sketch showing the principle of an arrangement for coating purposes.

FIG. 1 shows a high voltage electron-beam gun 10 connected to a direct current high voltage supply 12. The electron beam 16 emitted from the electron-beam gun 10 is directed onto a water-cooled plate 14 bearing the inorganic material 38 to be vaporized and its point of contact A with the plate 14 is scanned over the plate surface i.e. the electron beam travels, program controlled, over the surface of the inorganic material that is to be vaporized. In that process the inorganic material is heated by the energy of the impinging electron beam 16 and vaporizes.

An anode 20, for example in the form of a tungsten filament, is arranged, likewise in a water-cooled holder 18, in the region of the plate 14 with the material 38 to be vaporized. The anode 20 is connected to a direct current anode voltage supply unit 22. The coupling of the anode heating current takes place via a transformer 24.

Figure 2:
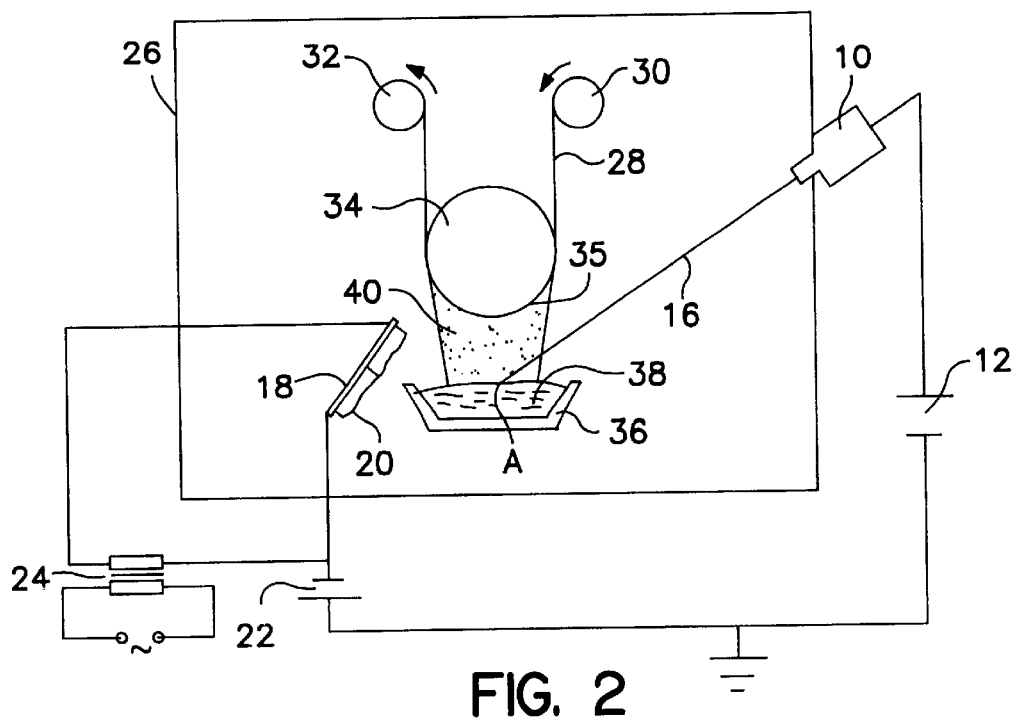
FIG. 2 a sketch showing the principle of an arrangement for coating coils of film material.

In the version according to FIG. 2 a plastic film 28 is uncoiled from a first roll 30 and pulled over a roll 34. The plastic film 28 lying on the roll 34 serving as a substrate support forms the substrate surface 35 in the working area. After the coating has been performed, the plastic film 28 is coiled onto another roll 32. For reasons of clarity, any deflection rolls have been omitted in the drawing.

The inorganic material 38 is heated by the electron beam 16 emitted by the electron-beam gun 10 forming a gas phase 40 of inorganic material 38.

Between the point of contact A where the electron beam 16 strikes the inorganic material in the crucible 36 and the heated anode wire 20 and under suitably chosen process parameters gas discharging occurs in the gas which is fed to the vacuum chamber 26 in metered amounts via a gas inlet system which is not shown in the drawing and in the gas phase 40 of inorganic material 38.

The anode 20 itself is prevented from being coated by heating the anode to a temperature above that at which the vaporized inorganic material 38 condenses.

This way the gas discharging can be maintained throughout the whole process. The electrostatic charging introduced by the electron-beam gun 10 flows to earth via the gas discharging with the result that a stable closed circuit of current is produced and an electric charge can no longer build up at sites where this is undesired. Furthermore, the coating material no longer becomes electrostatically charged; consequently there can be no defocusing of the beam.

As already mentioned, on selecting suitable process parameters a current equivalent to the emission current of the electron-beam gun 10 flows through the direct current anode voltage supply unit 22.

All inert gases, especially noble gases, preferably argon are suitable for non-reactive coating processes. If a reactive vapor coating process is to be performed, then the gas required for discharging may of course also be the reactive gas in question, or if desired combined with an inert gas.

For reasons of clarity, all auxiliary equipment and devices for heating the cathode of the electron-beam gun 10 have been omitted in FIGS. 1 and 2. Likewise, not shown in the drawing is a controllable gas feeding system with gas distribution system near the organic material to be vaporized, nor a system for measuring pressure.

Suitable inorganic materials for vaporization are in principle all known materials which, after precipitating from the gas phase, with or without chemical reaction, form a layer that serves as a barrier for gas and moisture. Examples thereof are silicon monoxide, silicon dioxide titanium oxide, zirconium oxide, aluminium oxide and magnesium oxide. These oxides may be mixed or doped. Further, these metals may be vaporized and, during the coating process, at least one reactive gas e.g. oxygen, nitrogen, hydrogen and/or acetylene introduced, with the result that the corresponding oxides, nitrides, carbides or mixed components are formed. Of course, reactive gases may also be added if the material to be vaporized is already present as oxide, nitride and/or carbide.

The voltage applied to the high voltage electron-beam gun is preferably at least 5 kV, especially at least 10 kV, at a current of some amperes. The high voltage electron-beam gun operates e.g. with an energy of 35 kW.

Using the process according to the invention deposition rates of at least 0.01 $\mu$m/sec are achieved, advantageously however in the region of 0.5 to 1 $\mu$m/sec.

The substrate surfaces to be coated by the process according to the invention, especially in the case of plastic films, are advantageously, moved during the coating stage. The rate of throughput of the plastic films usefully lies in the region of 1 to 10 m/sec, especially 3 to 6 m/sec. The plastic films are e.g. of polyester (PET), polyethylene (PE) or polyamide (PA).

Figure 3:
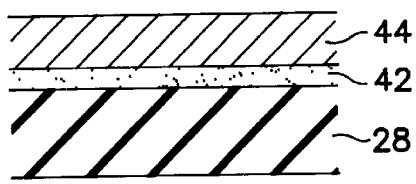
FIG. 3 cross-section through a coated laminate film.

The coated laminate film shown in FIG. 3 comprises a plastic film base 28, an inorganic layer 42 vapor deposited to provide a barrier to permeation and a sealable film 44 which has been applied after the vapour deposition process.

EXAMPLE

Plastic films with vapor deposited $SiO_x$ are employed today for producing transparent films with good barriers to permeation of gas and water vapor. The coating with $SiO_x$ is performed at high coating rates, usefully by means of electron beams. This process can be accelerated and stabilized by means of the process according to the invention with no electrostatic charging phenomena such as pinholes due to discharging or overlapping of the film due to electrostatic charging.

The width being coated is e.g. 700 mm. The polyester film to be coated is 12 $\mu$m thick. The crucible filled with SiO granules is e.g. 840 mm long. The anode is an e.g. 1 mm thick tungsten wire, which is situated, insulated, above the crucible slightly outside of the immediate zone where vaporization occurs. Likewise in the region of the crucible is a gas distribution pipe through which the gas is introduced and fed to the gas discharging zone via thin openings. The gas, argon for example, is fed to the vacuum chamber in a controlled manner regulated by pressure, and is kept at a constant pressure of e.g. $5 \times 10^{-4}$ mbar. The direct current anode voltage supply operates at a voltage of 250 V, and the heating of the tungsten wire anode is effected by a 50 Hz alternating current of 30 A. The accelerating voltage of the electron-beam gun is 35 kV, the emission current of the gun is 1.2 A. This current, however, also flows over the tungsten wire of the anode. Under the conditions set by the chosen parameters the thickness of the layer deposited on the film is 50 nm at a coating rate of 600 m/min, which is adequate to achieve a good barrier layer. This rate of vaporization is at least twice as high as the vaporization rate achieved by conventional coating units operating under conditions that do not lead to pronounced damage of the substrate film. The film can be coiled without the slightest problem of discharging. Also, there is no electrostatic discharging through the film.

We claim:

1. Device for coating, which comprises: a substrate surface; an anode spaced from the substrate surface; a vacuum chamber evacuated to at least $10^{-3}$ mbar; a layer of inorganic material in said chamber; a high voltage electron-beam gun for emitting an electron beam to bombard said inorganic material and vaporize same and deposit the vaporized inorganic material on the substrate surface, wherein gas discharge is created between the point of incidence (A) of the electron beam on the inorganic material to be vaporized and said anode such that the electrostatic charge created by the high voltage electron-beam gun flows off via the anode.

2. Device according to claim 1, wherein the anode is situated in the region of the inorganic material to be vaporized.

3. Device according to claim 2, wherein the anode is situated outside the immediate zone where vaporization occurs.

4. Device according to claim 3, wherein the inorganic material to be vaporized is situated in a crucible.

5. Device according to claim 3, wherein the inorganic material to be vaporized is situated in a water-cooled plate.

6. Device according to claim 1, wherein the anode is in the form selected from the group consisting of wire, rod, tube, mesh and net.

7. Device according to claim 1, wherein the anode is a material selected from the group consisting of tungsten, tantalum, molybdenum and graphite.

8. Device according to claim 1, wherein said substrate is a plastic film.

9. Device according to claim 1, wherein said substrate is a non-electrically conductive substrate and said substrate is coated with a non-electrically conductive material.

* * * * *